(12) United States Patent
Higgins (10) Patent No.: US 9,091,732 B2
(45) Date of Patent: Jul. 28, 2015

(54) ROTATING MACHINE SHAFT SIGNAL MONITORING METHOD AND SYSTEM

(75) Inventor: Simon Higgins, Johannesburg (ZA)

(73) Assignee: Eskom Holdings SOC Limited, Johannesburg (ZA)

( * ) Notice: Subject to any disclaimer, the term of this patent is extended or adjusted under 35 U.S.C. 154(b) by 602 days.

(21) Appl. No.: 13/140,763

(22) PCT Filed: Sep. 16, 2009

(86) PCT No.: PCT/IB2009/054040
§ 371 (c)(1),
(2), (4) Date: Sep. 7, 2011

(87) PCT Pub. No.: WO2010/070465
PCT Pub. Date: Jun. 24, 2010

(65) Prior Publication Data
US 2011/0313701 A1    Dec. 22, 2011

(30) Foreign Application Priority Data
Dec. 19, 2008   (ZA) ................................ 2008/10734

(51) Int. Cl.
*G01R 31/34*   (2006.01)
*G08B 21/00*   (2006.01)

(52) U.S. Cl.
CPC .................................... *G01R 31/343* (2013.01)

(58) Field of Classification Search
CPC ...... G01R 31/34; G01R 31/343; G01R 31/06; G05B 19/4065; G05B 2219/50197; G01B 7/00; G08B 21/00; G06F 19/00
USPC ............ 702/64, 67, 71, 77, 105, 58, 66, 183, 702/185; 73/462, 647; 324/500, 765.01; 322/99
See application file for complete search history.

(56) References Cited

U.S. PATENT DOCUMENTS

| | | | |
|---|---|---|---|
| 3,972,224 A | 8/1976 | Ingram | |
| 4,963,829 A | 10/1990 | Wereb | |
| 5,032,826 A * | 7/1991 | Miller et al. | .................. 340/647 |

(Continued)

FOREIGN PATENT DOCUMENTS

| | | |
|---|---|---|
| GB | 2324877 | 11/1998 |
| WO | 00/69062 A1 | 11/2000 |

OTHER PUBLICATIONS de Canha et al., Methods for Diagnosing Static Eccentricity in a Synchronous 2 Pole Generator, 2007 IEEE, pp. 2162-2167.*

(Continued)

*Primary Examiner* — Toan Le
(74) *Attorney, Agent, or Firm* — Nelson Mullins Riley & Scarborough LLP; Anthony A. Laurentano (57) ABSTRACT

This invention relates to a method of and system for monitoring shaft signals associated with a shaft of a rotating machine. The method comprising receiving voltage signals associated with the shaft; receiving current signals associated with the shaft; determining, from the received voltage and current signals, voltage and current data relating to the machine; presenting at least some of the determined voltage and current data to a user; trending at least the determined voltage data to at least determine voltage data trends associated with the machine; and determining from the voltage and current data if a fault condition has occurred and generating an alarm signal or condition in response thereto.

7 Claims, 4 Drawing Sheets

(56) References Cited

U.S. PATENT DOCUMENTS

| | | | |
|---|---|---|---|
| 6,091,236 A * | 7/2000 | Piety et al. | 324/103 P |
| 6,460,013 B1 * | 10/2002 | Nippes | 702/183 |
| 6,917,203 B1 * | 7/2005 | Perotti et al. | 324/418 |
| 7,034,706 B1 * | 4/2006 | Nippes | 340/648 |
| 8,457,913 B2 * | 6/2013 | Zwinger et al. | 702/77 |
| 2004/0109267 A1 * | 6/2004 | Habetler | 361/23 |
| 2005/0184751 A1 * | 8/2005 | Hobelsberger et al. | 324/772 |
| 2009/0156659 A1 * | 6/2009 | Butters et al. | 514/449 |
| 2010/0299090 A1 * | 11/2010 | Hobelsberger et al. | 702/58 |
| 2011/0119515 A1 * | 5/2011 | Sadwick et al. | 713/340 |

OTHER PUBLICATIONS

Bakhri, S. et al., "Investigation and Development of a Real-Time On-Site Condition Monitoring System for Induction Motors," Australasian Universities Power Engineering Conference, AUPEC 2007, pp. 1-6 (2007).

Bellini, Alberto et al., "Advances in Diagnostic Techniques for Induction Machines," IEEE Transactions on Industrial Electronics, vol. 55(12):4109-4126 (2008).

Busse, Dave et al., "Characteristics of Shaft Voltage and Bearing Currents," IEEE Industry Applications Magazine, vol. 3(6):21-32 (1997).

Le Roux, Wiehan et al., "Detecting Rotor Faults in Low Power Permanent Magnet Synchronous Machines," IEEE Transactions on Power Electronics, vol. 22(1):322-328 (2007).

Nippes, Paul I., "Early Warning of Developing Problems in Rotating Machinery as Provided by Monitoring Shaft Voltages and Grounding Currents," IEEE Transactions on Energy Conversion, vol. 19(2):340-345 (2004).

International Search Report for Application No. PCT/IB2009/054040, dated Jan. 28, 2010.

* cited by examiner

Time

FIGURE 3

Frequency

ROTATING MACHINE SHAFT SIGNAL MONITORING METHOD AND SYSTEM

RELATED APPLICATIONS

This application is a 35 U.S.C. 371 national stage filing of International Application No. PCT/IB2009/054040, filed Sep. 16, 2009, which claims priority to South Africa Patent Application No. 2008/10734 filed on Dec. 19, 2008 in South Africa. The contents of the aforementioned applications are hereby incorporated by reference.

BACKGROUND OF THE INVENTION

THIS invention relates to a method of and system for monitoring shaft signals associated with a shaft of a rotating machine.

Rotating machines having shafts such as large generators often have various physical phenomena associated therewith, for example, magnetic forces in the generator, static rubbing of steam on the turbine blades, or the like. These physical phenomena often result in voltages arising on the generator shaft and also currents flowing along it. It will be understood that this voltage and current information contains data associated with the condition of the generator, for example data associated with a rotor, stator and frame of the generator. Conventionally, these voltages and currents are obtained from voltage and current brushes mounted near the generator shaft, and arranged to contact the generator shaft.

Methods which evaluate the condition of rotating machines often can only be applied off-line and the on-line methods require expensive, permanently mounted hardware and expensive interpretation hardware which can only look at a single piece of information.

In this regard it is an object of the invention at least to analyse the signals on a shaft of a rotating machine, such as a generator, more efficiently and in a more cost effective manner thereby to determine a condition of the rotating machine.

SUMMARY OF THE INVENTION

According to a first aspect of the invention, there is provided a method for monitoring shaft signals associated with a shaft of a rotating machine, the method comprising:
  receiving voltage signals associated with the shaft;
  receiving current signals associated with the shaft;
  determining, from the received voltage and current signals, voltage and current data relating to the machine;
  presenting at least some of the determined voltage and current data to a user;
  trending at least the determined voltage data to at least determine voltage data trends associated with the machine; and
  determining from the voltage and current data if a fault condition has occurred and generating an alarm signal or condition in response thereto.

The method may comprise receiving a synchronisation signal to allow the received voltage and current data to be synchronised with an energising waveform.

The method may comprise trending the determined current data to at least determine current data trends associated with the machine.

The method may comprise:
  receiving voltage signals from at least a voltage brush associated with the shaft; and
  receiving current signals from at least a current brush associated with the shaft.

In a preferred example embodiment, the method may be carried out on-line.

Determining the voltage data from the received voltage signal may comprise determining a DC average voltage and a RMS voltage of the received voltage signal.

The method may comprise analysing harmonic content of the received voltage signal.

The method may comprise obtaining a Fast Fourier Transform (FFT) of the voltage signal.

The method may comprise generating and analysing an FFT display associated with the received voltage signal, the FFT display comprising information indicative of the harmonic content of the received voltage signal.

The method may comprise determining a frequency domain representation of the voltage signal.

Determining the current data from the received current signal may comprise determining a DC average current and a RMS current of the received current signal.

Determining the current data may comprise generating or updating a scatter plot.

The scatter plot may represent the phase resolved peak values of signals that are present on the shaft.

The method may comprise:
  generating interim scatter plots; and
  combining the generated interim scatter plots to produce a final scatter plot representing one time domain capture.

The method may comprise displaying voltage and/or current data to a user in the form of one or a combination of numeric displays of the actual shaft voltage and current signals, raw shaft voltage and current waveforms, harmonic content information associated with the voltage signals received from the voltage brush, scatter plot displays of the current signals received from the current brush, and alarm events and associated fault diagnostic information.

The method may comprise performing low frequency pulse recognition in the time domain and/or performing low frequency harmonic analysis on the received voltage and/or current signals.

The method may comprise using high frequency spectral analysis to determine problems associated with the machine.

The method may comprise comparing value/s comprising at least one or a combination of RMS average voltage and/or current, DC average voltage and/or current, signal harmonics, and scatter plot of the voltage and/or current signal with corresponding alarm values stored in a database thereby to determine if a fault condition has occurred.

Comparing the values and alarm values may comprise comparing the values against predetermined levels or thresholds of alarm values.

The method may comprise:
  recording each time a fault condition occurs;
  if the fault condition is not defined in the database, reporting or flagging the same for the user;
  the second time a particular fault conditions occurs, reporting the fault condition if a defined hold-off time has elapsed since the last occurrence of that particular fault condition.

According to a second aspect of the invention, there is provided a system for monitoring shaft signals associated with a shaft of a rotating machine, the system including:
  a voltage receiver module for receiving voltage signals from at least a voltage brush associated with the shaft;
  a current receiver module for receiving current signals from at least a current brush associated with the shaft;
  a processor for determining, from the received voltage and current signals, voltage and current data relating to the machine;

a database arranged to store at least the determined voltage and current data thereby to trend at least the determined voltage data to at least determine voltage data trends associated with the machine;

a user interface arranged to present at least some of the determined voltage and current data to a user; and an alarm module arranged to determine from the voltage and current information if a fault condition has occurred, the alarm module being further arranged to generate an alarm signal or condition in response a fault occurring.

The system may comprise a synchronisation module which allows the received voltage and current data to be synchronised to an energising waveform.

The system may comprise a data updating module arranged to update data in the database.

The processor may be arranged to determine a DC average voltage and RMS voltage for the received voltage signal; and DC average current and RMS current for the received current signal.

The processor may be arranged to:

apply Fast Fourier Transform (FFT) analysis to the voltage signal;

generate a FFT display and a harmonic trend of the voltage signal, the FFT display comprising at least corresponding harmonics or spectrum of the voltage signal; and analyse the generated FFT display.

The processor may be further arranged to generate or update a scatter plot.

The processor may be arranged to use EMI (Electromagnetic Interference) testing to determine problems associated with the machine.

DESCRIPTION OF PREFERRED EMBODIMENTS

In the following description, for purposes of explanation, numerous specific details are set forth in order to provide a thorough understanding of an embodiment of the present disclosure. It will be evident, however, to one skilled in the art that the present disclosure may be practiced without these specific details.

Figure 1:
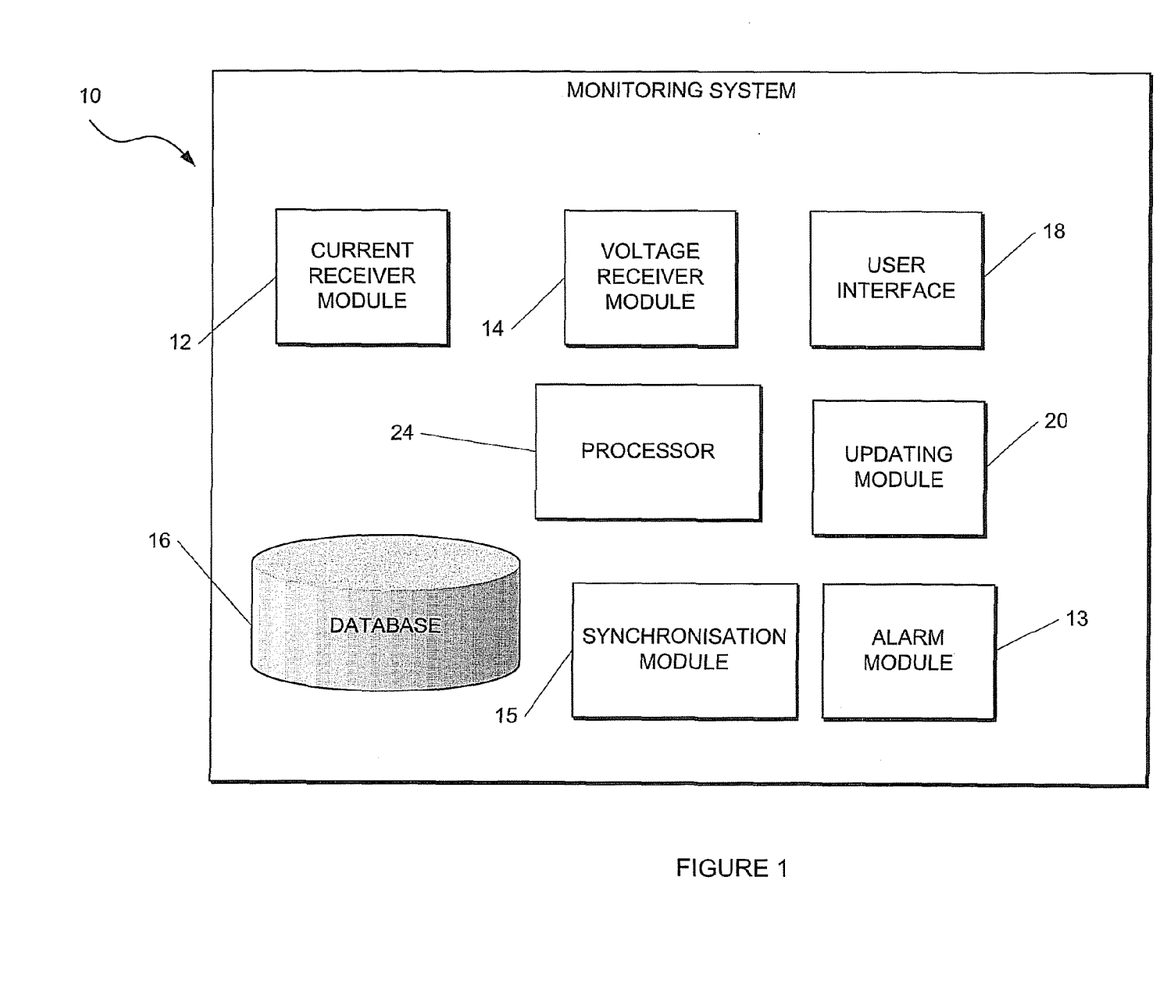
FIG. 1 shows a schematic level block diagram of a system in accordance with an example embodiment.

Referring to FIG. 1 of the drawings, a system for determining condition monitoring information of a rotating machine based on shaft signals is generally indicated by reference numeral 10. The system 10 provides for both monitoring and recording of new data, and playback of existing historical data sets. In one example embodiment, the rotating machine comprises a generator, or the like.

In a sample embodiment, the system 10 typically provides three levels of trending:

a) High resolution data (typically 2 second intervals) maintained for 24 hours;

b) Medium resolution data (settable intervals—typically 15 minutes)—maintained indefinitely. In an example embodiment the system 10 can only handle about a year worth of data, anything older has to be archived manually; and c) Low resolution data (typically 24 hour intervals).

Data for the three trending levels is stored in three corresponding data files in a database (described below).

The system 10 typically comprises a plurality of components or modules which correspond to the functional tasks to be performed by the system 10. In this regard, "module" in the context of the specification will be understood to include an identifiable portion of code, computational or executable instructions, data, or computational object to achieve a particular function, operation, processing, or procedure. It follows that a module need not be implemented in software; a module may be implemented in software, hardware, or a combination of software and hardware. Further, the modules need not necessarily be consolidated into one device but may be spread across a plurality of devices. In particular, the system 10 includes a current receiver module 12, a voltage receiver module 14, a synchronisation module 15, an alarm module 13, a user interface 18, an updating module 20, and a database 16.

The current receiver module 12 is arranged to receive current signals from a current brush associated with the machine shaft (not shown) whereas the voltage receiver module 14 is arranged to receive voltage signals from a voltage brush associated with the machine shaft.

The system 10 preferably includes a processor 24 for determining, from the received voltage and current signals, voltage and current data relating to the machine. The processor 24 is typically arranged to determine a DC average voltage and RMS voltage for the received voltage signal.

The processor 24 is also arranged to analyse harmonic content of the received voltage signal. The processor 24 is arranged to apply or obtain a Fast Fourier Transform (FFT) of the voltage signal. It follows that the processor 24 is therefore arranged to generate a FFT display and a harmonic trend of the voltage signal, a frequency domain representation of voltage signal harmonics, and a short-term trends representation comprising the more important harmonic components and the instantaneous value display of these harmonics. It will be understood that this data, in addition to the DC and RMS voltage, typically forms part of the voltage data. It will be noted that the FFT display is typically the corresponding harmonics or spectrum of the voltage signal.

The voltage signal is processed to a frequency of at least 1.50 kHz. However the upper limit can be higher than 1.50 kHz.

The processor 24 is further arranged to determine the DC average current and RMS current or RMS average current for the received current signal. The processor 24 is further arranged to generate or update a scatter plot (explained in greater detail below). The scatter plot is typically a phase resolved scatter plot. In this regard, it will be noted that the scatter plot represents the phase resolved peak values of pulse events that are present on the shaft. In addition to the determined DC and RMS average current, the current data may comprise the scatter plots or information associated therewith.

The system 10 is arranged such that the synchronisation module 15 provides the processor 24 with adequate information to allow the voltage and current data to be properly phase resolved, and the scatter plot to be correctly assembled.

Figure 3:
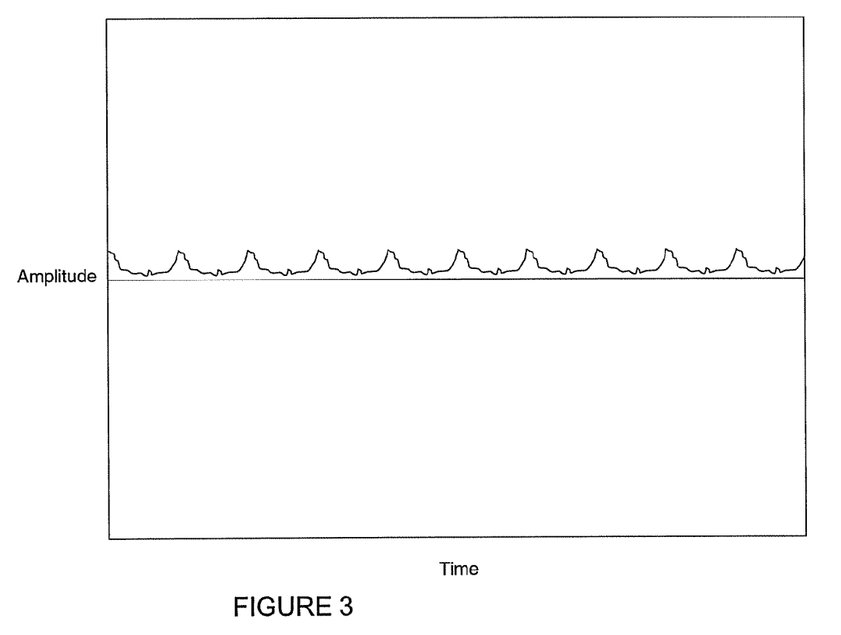
FIG. 3 shows a graphical representation of an example of a low frequency pattern in the time domain.

To interrogate voltage and current signals received from the shaft, the processor 24 is advantageously arranged to perform low frequency pulse recognition in the time domain. An example illustration of a low frequency pattern is the time domain is shown in FIG. 3. The processor 24 is arranged to analyse the pattern in the time domain and identify or determine at least the peak to trough ratio, the peak to average ratio, the frequency of the peaks, and the rise and fall times of the peaks.

Figure 4:
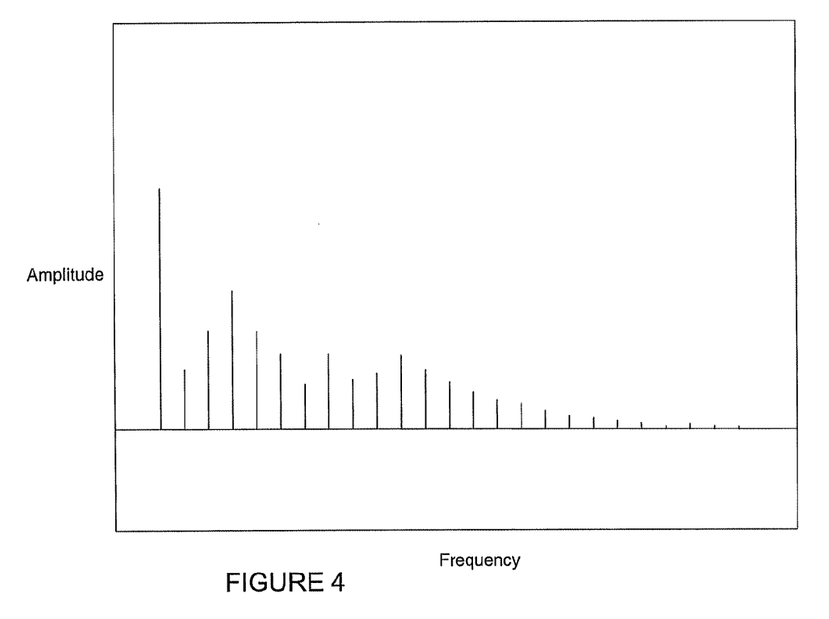
FIG. 4 shows a graphical representation of an example of a low frequency harmonic signal.

In an example embodiment, the processor 24 is also arranged to perform low frequency harmonic analysis on the received voltage and/or current signals. An illustration of a typical low frequency harmonic signal is shown in FIG. 4. Low Frequency Harmonic Analysis is advantageously used to localise individual faults by identifying a harmonic pattern associated with that particular fault. It will be appreciated that patterns of faults are stored in the database 16 as will be discussed below.

Figure 5:
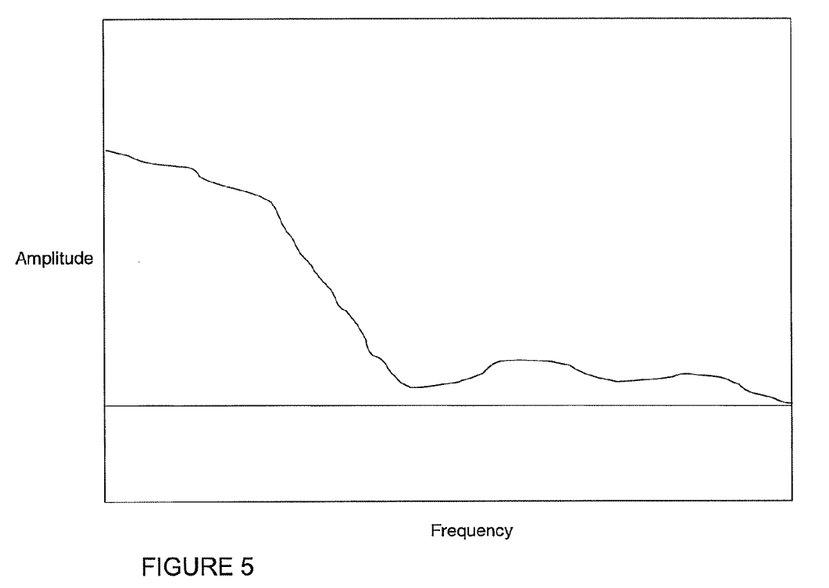
FIG. 5 shows a graphical representation of an example of a high frequency spectral analysis pattern.

In an example embodiment, the processor 24 is also arranged to use high frequency spectral analysis to determine problems associated with the generator. In particular, the processor 24 is arranged to use EMI (Electromagnetic Interference) testing to determine problems associated with the generator. An illustration of a typical high frequency spectral analysis pattern is shown in FIG. 5.

Figure 6:
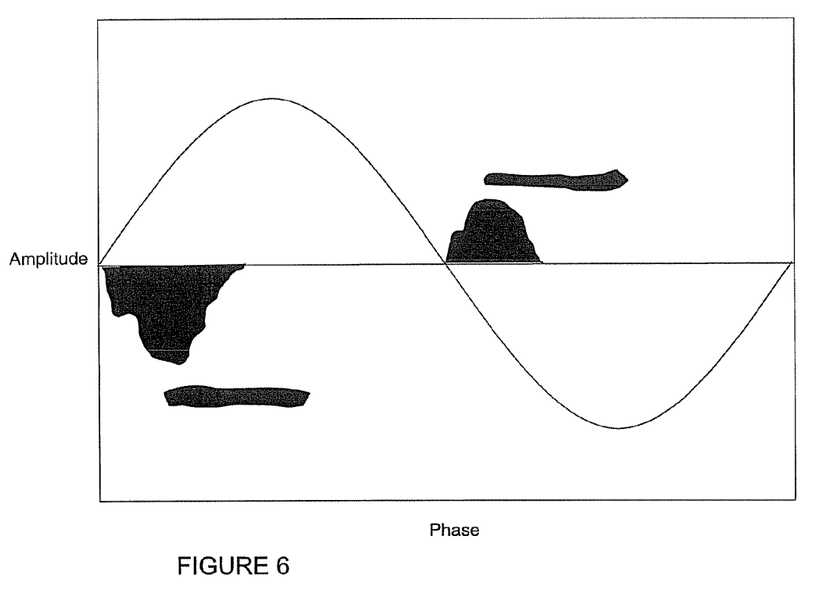
FIG. 6 shows a graphical representation of an example of a time domain high frequency pattern versus energizing half waveforms.

The processor 24 may further be arranged to use high frequency pattern recognition versus the energizing half waveforms to at least identify faults in the generator. The processor 24 may therefore make use of phase resolved patterns in order to do this. The processor 24 requires the output of the synchronisation module 15 to achieve this. An illustration of a typical high frequency pattern versus the energizing half waveforms is shown in FIG. 6.

It will be noted that the database 16 is arranged to store the determined voltage and current data thereby to trend at least the determined voltage data to at least determine voltage data trends associated with the generator. These trends are typically stored in trends records in the database 16. It will be noted that the DC and RMS current are also trended in the database 16.

An acquisition unit, in the current receiver module 12, is arranged to process the pulses from the current brush. The acquisition unit has a frequency response from 150 kHz to 250 MHz.

The user interface 18 typically includes a GUI displayable to a user by way of a monitor of a personal computer, laptop, PDA, or the like. The user interface 18 is therefore arranged to receive data from a user and also to present at least some of the determined voltage and current data to the user. It follows that the user interface 18 is therefore arranged to display voltage and/or current data to the user in the form of numeric displays of the actual shaft voltage and current signals, raw shaft voltage and current waveforms, harmonic content information associated with the voltage signals received from the voltage brush, scatter plot displays of the current signals received from the current brush, and alarm events and associated fault diagnostic information (discussed below). It will be appreciated that most of the information or data pertaining to the generator, which is displayed by the user interface 18, is generated by the processor 24.

The system 10 includes a data updating module 20 arranged to update data in the database 16. This data may be current and voltage data, trend data or records, or any data hereinbefore mentioned. It will be noted however, that trend data may be interpreted from previous voltage and current data. In an example embodiment, the data updating module 20 is arranged to update particular configuration files stored in the database.

In an example embodiment the user interface 18 is arranged to prompt a user for information indicative of the generator thereby to identify the generator. The user interface 18 may therefore be arranged to prompt the user for information which includes the generator or power station name, unit number, earthing configuration, or the like.

The system 10 is arranged to search the database 16 for any existing historical voltage and/or current data trends relating to the identified generator being monitored. The system 10 is conveniently arranged to retrieve any located historical trends from the database 16 and present the same to the user via the user interface 18. In certain example embodiments, the user interface 18 presents information to the user in a read-only format.

The system 10 is arranged to obtain a timestamp for the latest capture.

Depending on the input, the processor 24 may be arranged to apply appropriate amplitude scaling factors to compensate for transducer factors to at least the received voltage signal. A corresponding voltage time domain waveform may then be presented to the user via the user interface 18.

For ease of explanation, in an example embodiment the values (for a 50 Hz machine) which are trended (and stored in the database 16) by the processor 24 are:
Current brush RMS
Current Brush DC
Voltage brush RMS
Voltage brush DC
Voltage brush 25 Hz
Voltage brush 50 Hz
Voltage brush 100 Hz
Voltage brush 150 Hz
Voltage brush 200 Hz
Voltage brush 250 Hz
Voltage brush 300 Hz
Voltage brush 350 Hz
Voltage brush 400 Hz
Voltage brush 450 Hz
Voltage brush 500 Hz
Voltage brush 550 Hz
Voltage brush 600 Hz
Voltage brush 650 Hz
Voltage brush 700 Hz
Voltage brush 750 Hz
Voltage brush 800 Hz
Voltage brush 850 Hz
Voltage brush 900 Hz
Voltage brush 950 Hz
Voltage brush 1000 Hz It will be noted that for a machine operating at a frequency of other than 50 Hz, these values are scaled accordingly.

Current brush and voltage brush as listed above relate to the current and voltage signals received from the current and voltage brushes respectively.

As previously mentioned, the processor 24 is arranged to analyse the current signal which is typically a time domain waveform or signal. The processor 24 is then arranged to apply scaling to the current signal to compensate for transducer factors, and generate and display a corresponding scatter plot to the user via the user interface 18. The updating module 20 is arranged to update a record of scatter plots in the database 16.

It will be appreciated that each scatter plot is a graphical display of time domain results collected and superimposed over a period of time. The scatter plots are three-dimensional—the horizontal axis represents a 20 millisecond mains-waveform period. The vertical axis represents signal amplitude. The image intensity axis represents counts of similar events. Typically, a scatter plot consists of a number of dots, representing amplitude levels of time domain waveforms. The colour of each dot represents the number of such occurrences.

Each time domain capture that is acquired by the system 10 is analysed by the processor 24, and referenced to the synchronisation module 15, to produce an interim scatter plot, having for example 1 bit intensity resolution. A number (typically 240) of these interim scatter plots are then combined to produce the final scatter plot that is displayed by the user interface 18. This final plot has 8 bit intensity resolution. The interim scatter plots are stored in local memory on a first in first out (FIFO) basis, so that the final scatter plot always contains the latest results.

Each time domain current brush waveform that is acquired by the system 10 is processed by the processor 24 as follows to produce an interim scatter plot. The first number of milliseconds displayed in this waveform corresponds to the duration of one energising waveform cycle extracted. This data has a higher horizontal resolution than is available on the scatter plot. Thus several points on the time domain waveform is represented with a single 'time slice' of the scatter plot.

If one considers one time slice of a scatter plot and the corresponding subset of points in the time domain capture that map to it, the time slice of the scatter plot contains a number of vertical divisions. For each of these divisions, a value of 0 is assigned by the processor 24 if the time domain waveform subset has no points at that amplitude, and a value of 1 if the time domain waveform subset has one or more points at that amplitude.

This is repeated for each time slice of the interim scatter plot. The result is a scatter plot representing only one time domain capture. At each location, the interim scatter plot has a minimum value of 0, and a maximum value of 1.

In a sample embodiment, the system 10 monitors if the date of data capture or reception has changed, and if so, creates a new file structure for logging data in the database 16. This is typically done every 24 hours to keep fileset sizes manageable. It follows that the processor 24 is arranged to manage the size of high resolution trends records in the database 16.

The updating module 20 is arranged to append latest DC, RMS and voltage brush harmonic values to the high resolution trends file.

It will be noted that each time an entry is made to the medium resolution trends data file, a full set of data (voltage brush time domain and harmonic traces, plus current brush scatter) is recorded in the database 16.

Such a logging event can occur for example when:
a) The prescribed logging interval for medium resolution data has been reached.
b) A reportable fault has occurred, as outlined below.

If the date of data capture follows into the next day, the processor 24 computes delta values for RMS, DC and voltage brush harmonic values.

The alarm module 13 is typically arranged to determine from the voltage and current information if a fault condition has occurred, the alarm module 13 being further arranged to generate an alarm signal or condition in response a fault occurring. In an example embodiment, the alarm module 13 is arranged to compare levels of RMS, DC and voltage brush harmonics against corresponding alarm levels or thresholds stored in, for example an alarms configuration file in the database 16. It will be noted that recent alarm events, together with suggestions of possible causes of the alarms are displayed to the user via the user interface 18.

In a preferred example embodiment, the alarms configurations file is in the form of or includes a look-up table of known fault conditions that are defined in term of their harmonic content in order to determine if a particular condition is a fault condition. The alarm module 13 optionally makes use of harmonic pattern recognition with patterns stored in the look-up table to recognise faults.

New fault conditions can be advantageously stored in the fault table in the database 16. If applicable, the processor 24 also compares delta values with corresponding alarm levels or thresholds.

The alarms configuration file or the look-up table contains 'orange' and 'red' threshold levels for each key value (typically at least certain elements of the determined voltage and current data) to be compared. Each key value is compared to these and rated as green, orange or red for example. Key values that are orange or red are grouped together to form a list. This list is compared against known fault definitions lists stored in the database 16. If the present list matches any fault definitions lists or entries therein, a list of possible causes for the fault is retrieved from the database 16 and is present to the user. If it is not contained in the database 16, a result of 'unknown fault' is returned to the user.

A preferred example embodiment features a refinement that each time a fault occurs, a record is kept of the number of occurrences of that fault. If it is a new fault, it is reported to or flagged for the user. The second time the same fault occurs, it is only reported if a defined hold-off time has elapsed since the last occurrence. Each time the same fault occurs, the hold-off time for that fault is dynamically adjusted. Thus duplicate faults occurring in a short space of time are not reported. If a particular fault is persistent, its holdoff-time grows to a limit of 24 hours. Should that fault then desist, its holdoff-time is progressively reduced back to the default.

When a reported alarm occurs, it is entered into the alarms log file by the updating module 20, and an entry is made in the main medium resolution trends file. A full set of data (voltage brush time domain and harmonic traces, plus current brush scatter) is also recorded in the database 16. This constitutes an additional entry into the data logs over and above the regular, set interval logging.

If an alarm which is due to be logged has occurred, or a scheduled logging interval has been reached, the updating module 20 is arranged to store, in the database 16, the latest data which includes the latest scatter plot, voltage brush time domain waveform and spectrum.

A number of faults may be identifiable based on the harmonic pattern recognition as hereinbefore mentioned. For a generator, these faults may be for example sagging of the rotor, rotor magnetic asymmetry, problems with rotor protection equipment, problems within the magnetic circuit of the stator, any large spark from within the machine, the use of segmental punching, joints in the stator laminations, rotor eccentricities, split stator cores, split rotor cores, stator sagging, the use of stator segments of different permeability, un-symmetrical stacking of the core, unevenly spaced axial cooling ducts, steam problems in the turbine, sparking from the bearings, stray flux imbalances, rotor earth faults, exciter problems, or the like.

The system 10 may be arranged to allow either the live capture and display of present data, or the playback and display of previously captured data.

The invention will now be described, in use, with reference to FIG. 2. A flow diagram of the example method shown in FIG. 2 is described with reference to FIG. 1, although it is to be appreciated that the example methods may be applicable to other systems (not illustrated) as well.

Figure 2:
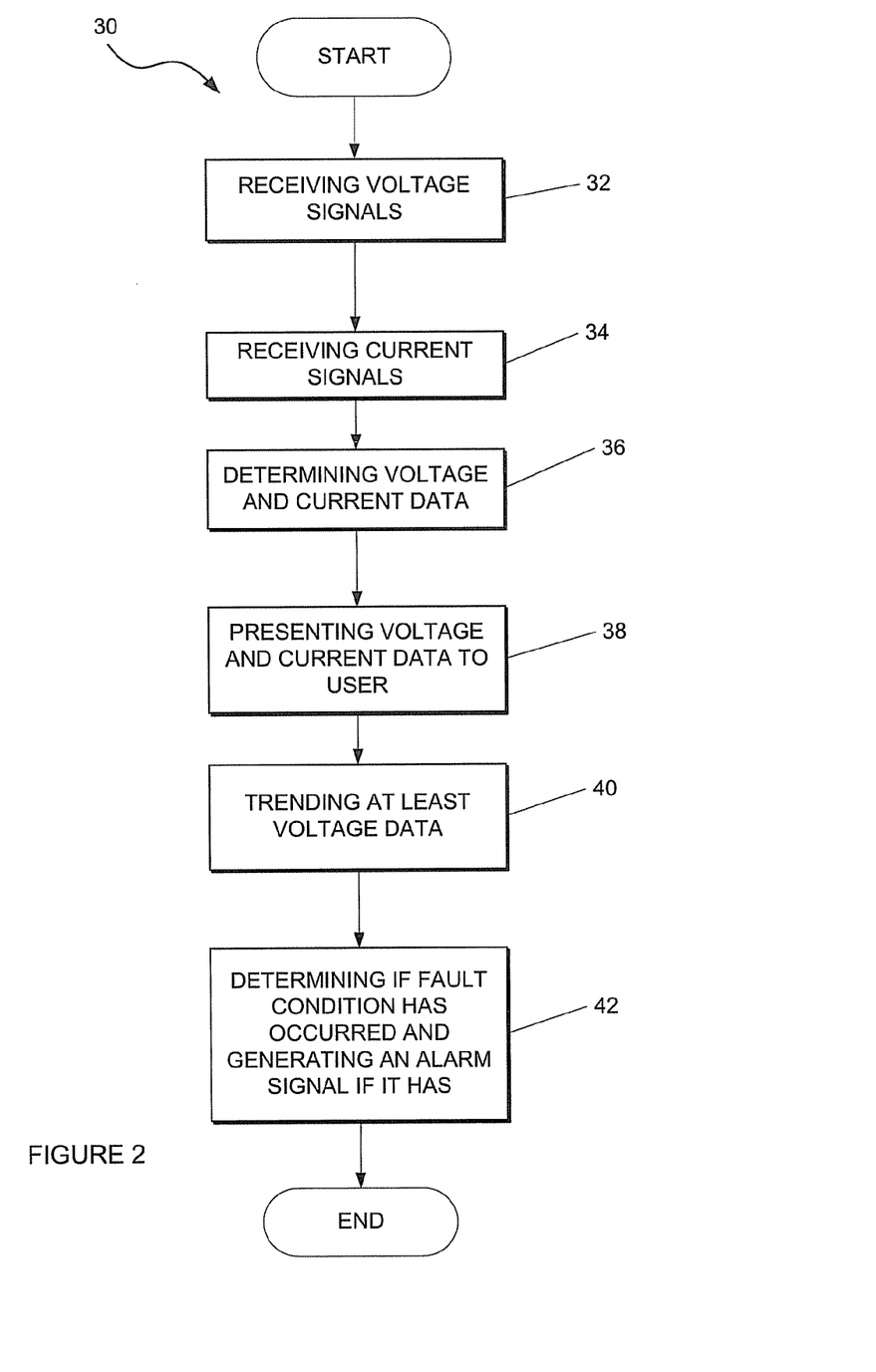
FIG. 2 shows a flow diagram of a method in accordance with an example embodiment.

In FIG. 2 the flow diagram of a method in accordance with an example embodiment is generally indicated by reference numeral 30.

The method 30 includes receiving, at block 32, voltage signals from the voltage brush associated with the shaft by way of the voltage receiver module 14.

Similarly, the method 30 includes receiving, at block 34, current signals from the current brush associated with the shaft by way of the current receiver module 12. It will be appreciated that the method steps at blocks 32 and 34 may occur simultaneously or in parallel.

Once the voltage and current signals are received, the method 30 includes determining, at block 36 by way of the processor 24, from the received voltage and current signals, voltage and current data relating to the generator being monitored as hereinbefore described. It follows that method 30 also includes referencing this data to the output of the synchronisation module 15. This may include receiving a synchronisation signal to allow the received voltage and current data to be synchronised with an energising waveform.

The method 30 also includes determining the DC and RMS voltage and current as hereinbefore described. The method 30 also includes performing a FFT on the voltage signal, and generating or processing a scatter plot for the current signal as hereinbefore described.

The method 30 then includes presenting, at block 38, at least some of the determined voltage and current data to a user via the user interface 18. It will be noted that a user is able to assess the condition of the machine (generator) from the information which the system 10 presents to them.

The method 30 also includes trending, at block 40, at least the determined voltage data to at least determine voltage data trends associated with the machine. The method 30 typically includes trending both the determined voltage and current data in the database 16. The user may optionally retrieve tending information or data from the database 16 via the user interface 18.

In a preferred example embodiment, the method 30 includes determining, at block 42, from the voltage and current data if a fault condition has occurred and generating an alarm signal or condition in response thereto as hereinbefore described by way of the alarm module 13. In an example embodiment the method 30 therefore includes comparing levels of RMS, DC and voltage brush harmonics against corresponding alarm levels or thresholds stored in the database 16. If applicable, the method 30 includes comparing delta values with corresponding alarm levels or thresholds. If an alarm has occurred, or a scheduled logging interval has been reached, the method includes storing, in the database 16, the latest determined current and voltage data which includes inter alia voltage brush time domain and harmonic traces, plus current brush scatter, plus an entry in the medium resolution trends file.

In an example embodiment when in playback mode the method includes prompting the user by way of the user interface 18 for information indicative of the generator in a similar fashion as hereinbefore described for the logging mode.

The method includes searching the database 16 for any existing historical trends similarly to the fashion as hereinbefore described. Also similarly to the logging mode, the method includes retrieving any located historical trends from the database 16 and presenting the same to the user via the user interface 18.

The method includes presenting relevant configuration information in read-only format to the user.

The method also includes presenting to the user, via the user interface 18, the time domain voltage brush record matching a current playback point in the fileset.

The method may include presenting the voltage brush harmonic record matching the current playback point in the fileset to the user.

The method may include presenting to the user the RMS and DC values of the current and voltage from the point in the trends file matching the current playback point in the fileset.

The method may include presenting the scatter plot matching the current playback point in the fileset to the user. The method may also include presenting to the user the most recent alarm events (from the alarms log file) immediately preceding the current playback point in the fileset. At least some of the steps corresponding to the playback mode may be repeated at predetermined or user selectable intervals.

The method may include displaying the raw time domain waveforms, which were corrected for transducer factor scaling at the time of logging.

The method may include updating fields that display average and peak values of both RMS and DC components of the current and voltage, plus a summary of recent alarm events.

The method may include presenting to a user a display which typically has the following components:

a) Time domain representation of voltage brush waveform.
b) Frequency domain representation of voltage signal harmonics.
c) Scatter plots of signals from the current brush.
d) Short-term trends window representing the more important harmonic components.
e) Instantaneous value display of the quantities in d).

The invention as hereinbefore described provides a way more conveniently to analyse rotating machines shaft signals thereby to provide condition monitoring information of the rotating machine. The system as hereinbefore described is able to advantageously display a trend of individual harmonics from the voltage brush.

The invention claimed is:

1. A method for monitoring shaft signals associated with a shaft of a rotating machine, the method comprising:
receiving a plurality of voltage signals associated with the shaft;
receiving a plurality of current signals associated with the shaft;
providing a processor arranged for:
calculating and trending a root mean square (RMS) and average shaft voltage;
calculating and trending harmonic content of the shaft voltage;
if harmonic content is high then identifying a potential fault;
grouping voltage harmonics together and storing them with previously stored harmonics to further identify faults;
receiving a synchronization signal to allow the received current signal to be synchronized with an energizing waveform;
for relatively low frequency components of the received current and voltage signal, calculating and trending RMS current and DC average current and voltage;
for the relatively low frequency current components, calculating and trending peak current and average current;
for the relatively high frequency current components, creating a scatterplot, wherein the scatterplot represents phase resolved peak values of signals that are present on the shaft;
storing the scatterplot in a database;

compare the scatterplot with previously stored scatterplots to identify potential faults;
if a fault condition exists then notifying a user that a fault condition exists;
capturing electromagnetic interference (EMI) data;
compare the EMI data with previously stored EMI data to identify potential faults; and
if a fault condition exists then notifying a user that a fault condition exists; and
displaying the EMI data or the scatterplot to a user via a user interface.

2. The method as set forth in claim 1, further comprising
receiving the voltage signals from at least a voltage brush associated with the shaft; and
receiving the current signals from at least a current brush associated with the shaft.

3. The method as set forth in claim 1, further comprising
obtaining a Fast Fourier Transform (FFT) of the voltage signal, and
generating and analyzing an FFT display associated with the received voltage signal, the FFT display including information indicative of the harmonic content of the received voltage signal.

4. The method as set forth in claim 1, further comprising
generating interim scatterplots; and
combining the generated interim scatterplots to produce a final scatterplot representing one time domain capture.

5. The method as set forth in claim 1, further comprising
recording each time a fault condition occurs;
if the fault condition is not defined in a database, reporting or flagging the same for the user;
the second time the fault conditions occurs, reporting the fault condition if a defined hold-off time has elapsed since the last occurrence of the fault condition.

6. A system for monitoring shaft signals associated with a shaft of a rotating machine, the system comprising:
a voltage receiver module for receiving voltage signals from at least a voltage brush associated with the shaft;
a current receiver module for receiving current signals from at least a current brush associated with the shaft;
a synchronization module which allows the received current signal to be synchronized with an energizing waveform,
a processor arranged for:
calculating and trending a root mean square (RMS) and average shaft voltage;
calculating and trending harmonic content of the shaft voltage;
if harmonic content is high then identifying a potential fault;
grouping voltage harmonics together and storing them with previously stored harmonics to further identify faults;
for relatively low frequency components of the received current and voltage signal, calculating and trending the RMS current and DC average current and voltage;
for the relatively low frequency current components, calculating and trending peak current and average current;
for the relatively high frequency current components, creating a scatterplot, wherein the scatterplot represents phase resolved peak values of signals that are present on the shaft;
storing the scatterplot in a database;
compare the scatterplot with previously stored scatterplots to identify potential faults;
capturing electromagnetic interference (EMI) data; and
compare the EMI data with previously stored EMI data to identify potential faults;
a database arranged to store at least voltage and current data;
a user interface arranged to present at least a portion of the voltage and current data to a user including the scatterplot and the EMI data; and
an alarm module arranged to notify a user if a fault condition exists.

7. The system as set forth in claim 6, wherein the processor is further arranged to
apply Fast Fourier Transform (FFT) analysis to the voltage signal;
generate a FFT display and a harmonic trend of the voltage signal, the FFT display comprising at least corresponding harmonics or spectrum of the voltage signal; and
analyze the generated FFT display.

* * * * *